United States Patent [19]

Roch

[11] 4,123,706
[45] Oct. 31, 1978

[54] PROBE CONSTRUCTION

[75] Inventor: Jacques L. Roch, San Jose, Calif.

[73] Assignee: Electroglas, Inc., Santa Clara, Calif.

[21] Appl. No.: 758,393

[22] Filed: Jan. 11, 1977

Related U.S. Application Data

[63] Continuation of Ser. No. 554,645, Mar. 3, 1975, abandoned, which is a continuation-in-part of Ser. No. 436,844, Jan. 28, 1974, Pat. No. 3,939,414.

[51] Int. Cl.$^2$ .................... G01R 1/06; G01R 31/02
[52] U.S. Cl. ................... 324/158 P; 324/72.5; 324/158 F
[58] Field of Search ............. 324/158 P, 158 F, 149, 324/72.5

[56] References Cited

U.S. PATENT DOCUMENTS

| | | | |
|---|---|---|---|
| 3,551,807 | 12/1970 | Kulischenko et al. | 324/72.5 |
| 3,590,372 | 6/1971 | DeSantis et al. | 324/72.5 |
| 3,641,972 | 2/1972 | Hostetter | 324/158 P |
| 3,714,572 | 1/1973 | Ham et al. | 324/158 P |

Primary Examiner—Rudolph V. Rolinec
Assistant Examiner—Ernest F. Karlsen
Attorney, Agent, or Firm—Ellsworth R. Roston

[57] ABSTRACT

A probe for testing an electrical circuit includes a dielectric support body and a pair of spring arms each having an inner end fixed to the support body and an outer end free to deflect with respect to the support body. Means for connecting the outer ends of the arms supports a probe tip having a point movable with the deflection of the arms into contact with a predetermined point on the electrical circuit to be tested. Means responsive to a signal provides for the deflection of the arms and the movement of the probe tip into contact with the chip. The arms have different lengths providing the probe tip with movement along a substantially straight line with respect to the plane of the electrical circuit.

26 Claims, 6 Drawing Figures

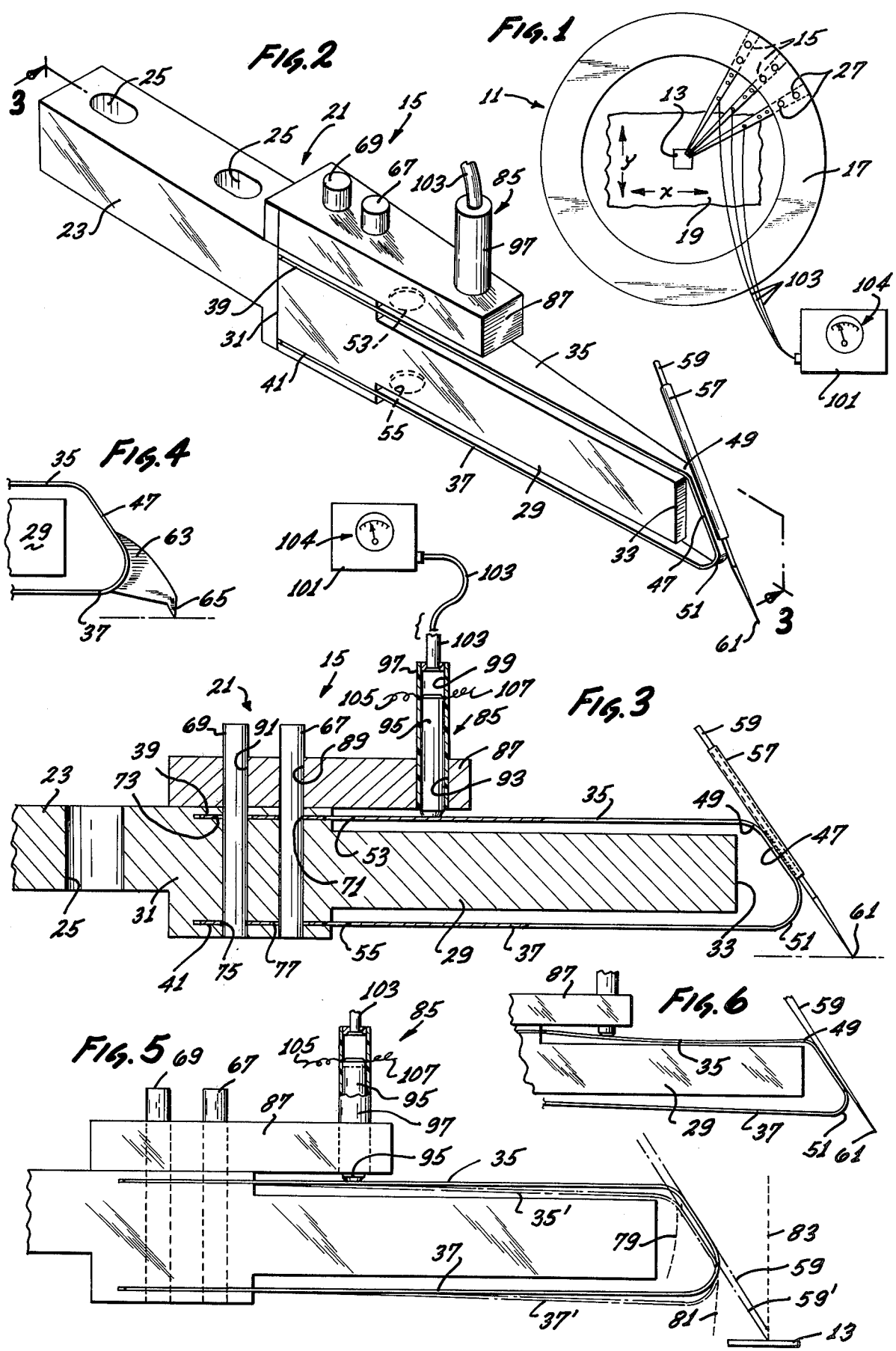

PROBE CONSTRUCTION

This is a continuation of application Ser. No. 554,645 filed Mar. 3, 1975 now abandoned, which in turn was a continuation-in-part of application Ser. No. 436,844 filed Jan. 28, 1974, now U.S. Pat. No. 3,939,414.

BACKGROUND OF THE INVENTION

1. Field of the Invention

This invention relates generally to probes and more specifically to probes adapted for use in testing microcircuits commonly associated with miniaturized electronic components sometimes referred to as chips.

2. Description of the Prior Art

Apparatus for probing and testing electrical circuits has typically included a base member and a table movable in two horizontal directions relative to the base member. A chuck supporting the electrical circuit or chip being tested has been carried by this table and has been actuatable to move the chip relative to the table in a generally vertical direction. A plurality of probes have each had a support member attached to the base member. Each of the probes has further included a probe arm having a fixed end attached to the associated support member and a free end extending into proximity to the chip being tested. A probe tip has been disposed at the free end of each of the probes. With the raising of the chip by the chuck, a predetermined point on the chip has been brought into contiguous relationship with an associated one of the probe tips to test the associated circuit.

As noted, the movement of the chip relative to the tips of the probes has typically been accomplished by providing the table with a chuck for raising the chip into contact with the probe tips. The movement of the chip to contact the probes has been relatively slow due mainly to the combined mass of the chuck and the chip which is relatively great as compared to the mass of the probes. Further, the use of sliding members which undergo wear with continued usage has been required in providing vertical movement of the chuck and chip relative to the table.

It is generally desirable that all of the probe tips contact the associated predetermined points on the chip with approximately the same probing force. Then by carefully adjusting the probing force, one can ensure that all of the probes make contact with the chip and further ensure that none of the probes damage the circuit being tested. In the past, the probe arms have been provided with spring characteristics so that the probing force has been dependent upon the deflection of the associated probe arm. In order to provide a substantially uniform probing force, it has been desirable to provide the probe arms with the same spring constant and then to ensure that the probes deflect the same distance. To provide a constant deflection distance, it has been desirable to planarize the probe tips; in other words, adjust the probes so that the probe tips lie in a single plane. This planarization requires very fine adjustments which have been difficult to make. Furthermore, the probe tips must not only be planarized with respect to each other but also with respect to the plane of the chip.

The deflection of the spring arms has also been dependent upon the particular point at which the probe tip contacts the chip. If the chip surface is irregular, the deflection will vary depending upon whether the probe tip contacts a peak or a valley on the chip surface.

One means of providing a substantially constant probing force has been to preload the spring probing arms. This has been accomplished by biasing the probing arms in the direction of the chip. The probing force is then equal to the preload force, plus any additional force produced by deflection of the probe arms. Since the preload force is a large percentage of the total probing force, it is necessary that the probes be planarized so that all of the probes will receive the preloading force.

With preloading of the probe arms, the spring constant and preloading characteristics of the probe arms have heretofore been set by the manufacturer. This has not left the user of the testing apparatus with sufficient control over the magnitude of the probing force since the user has not been able to independently vary the preloading of the probe arms.

Most of the probes of the prior art have either used a single probe arm or a pair of probe arms of equal length. In both types of probes, the raising of the chip in contact with the probe tip has caused the probe tip to deflect along an arcuate path. This result, which is commonly referred to as physical arcing, has tended to scratch and therefore physically damage the electrical circuit being tested.

In some prior art testing apparatus, the chip has been moved in a plane substantially parallel to the probe tips with the probes being moved into contact with the chip. In one apparatus, piezoelectric crystals have been provided in the probe arms and have been energizable by electrical signals to deflect the probe arms into contact with the chips. A problem in this type of probe is that the piezoelectric crystals may warp during deflection so that the accuracy of contact between the probe tip and the chip has been difficult to maintain.

Also, piezoelectric crystals are energized by electrical signals which create electrostatic and magnetic fields. Such fields are undesirable since they may tend to damage metal-oxide-silicon semiconductors which may form the chips being tested. Furthermore, the piezoelectric crystals used in the probe arms of the prior art have been fragile with the result that the probe arms may be easily damaged.

SUMMARY OF THE INVENTION

In accordance with the present invention, there is provided a novel probe which is used in an apparatus that includes a plurality of the probes and a table for supporting the chip to be tested. The table is movable in a plane substantially parallel to the tips of the probes while the probes are movable with respect to the table to contact the chip with substantially constant probing forces. The probe tips, which need not be precisely planarized, can be deflected over a significant range to facilitate the probing of irregular surfaces. Also, the probing can be accomplished in a relatively short period of time since the mass of the probes is relatively small. The deflection of the probe arms of the novel probes can be carefully controlled so that the probe tips move relative to predetermined points on the chip along straight lines that are substantially perpendicular to the predetermined points to significantly reduce the horizontal probe tip movement which has tended to produce physical arcing in the testing apparatus of the prior art. Also, the deflection of the probe tips in the novel probes can be accomplished without the use of electrical signals which may injure the substrate material of a metal-oxide-silicon semiconductor being tested.

The novel probes of the invention do not require preloading and, thus, can be used to provide a significant movement of the probe tips in probing irregular hybrid surfaces. For example, the deflection of the probe tips may be as great as about 0.060 inches with the probing force per unit of deflection being relatively low in comparison with the probing force caused by a slight movement of the probe tip against a preloaded probe arm. Planarizing of the probes of the present invention is, thus, not as critical as the planarizing of prior art probes.

The present apparatus may include a base member having a fixed relationship with the table supporting the chip during probing of the chip. Each of the probes then includes a supporting body which is fixed to the base member. A first probe arm may be employed which has a length defined by a fixed end attached to the supporting body and a free end extending from the support member. Also, a second support arm may be employed which has a length defined by a fixed end attached to the supporting body and a free end extending from the support member. The free ends of the probe arms, which are displaced from each other, are preferably connected so that they move simultaneously.

In moving the probe tip of the probe into contact with the chip, a sleeve may be employed which has a substantially fixed relationship with respect to the supporting body and defines a chamber which contains a piston. A pressurized fluid introduced into the chamber, thus, moves the piston relative to the sleeve to deflect the first and second probe arms which moves the probe into contact with a predetermined point on the chip.

The second probe arm has a length which is less than that of the first probe arm so that the deflection causes the free end of the second probe arm to traverse an arc that has a greater component of horizontal movement than the arc traversed by the first probe arm. This complex movement of the probe arms enables the probe tip to move in a substantially vertical direction relative to the chip to inhibit physical arcing during testing of the chip.

It is of particular importance that the probing force is more dependent upon the pressure of the fluid introduced into the chamber than upon the deflection of the probe arms. As a result, the probing force of the probes can be maintained substantially constant even with significant differences in the deflection of the individual probe arms. This is particularly desirable when probing an irregular surface such as the surface of a hybrid chip. Since the same fluid can be introduced to each of the chambers associated with the probes, the probing forces exerted by all the probes can be adjusted simultaneously by varying the pressure of the fluid.

By providing some degree of separation between the piston and the surrounding sleeve, a portion of the fluid in the chamber, e.g., air, can be permitted to escape between the piston and the cylinder wall. This will provide a bearing between the piston and sleeve to maintain movement between the piston and sleeve in a substantially frictionless relationship.

To determine the position of the probe tips relative t the chip being tested, wires may be connected to the sleeves with the wires providing electrical continuity when the piston is in a particular position relative to its associated sleeve. This continuity or lack of continuity may then be used in controlling movement of the table which supports the chip being tested so as to insure that the table is not moved when the probe tips are in contact with the chip.

By moving the probe tips relative to the chip being tested as opposed to moving the chip into contact with the probe tips, maintenance of the testing apparatus is easier since relatively few moving parts are required to move the probe tips. Furthermore, the testing apparatus can be smaller in size through elimination of the chuck that was previously used to move the chip into contact with the probe tips.

BRIEF DESCRIPTION OF THE DRAWINGS

To further illustrate the invention, reference is made to the accompanying drawings in which:

FIG. 1 is a plan view of an embodiment of a chip testing apparatus including a plurality of probes of the present invention;

FIG. 2 is a perspective view of one of the probes illustrated in FIG. 1;

FIG. 3 is a cross-sectional view taken on line 3—3 of FIG. 2;

FIG. 4 is a cross-sectional view similar to that shown in FIG. 3 in which the probe tip has been varied;

FIG. 5 is a side-elevational view of a probe as illustrated in FIG. 2 showing the deflection characteristics of the tip of the probe, and FIG. 6 is a side-elevational view, similar to FIG. 5, which illustrates controlled bowing of the upper probe arm to provide an additional horizontal movement at the free end of the upper probe arm.

DETAILED DESCRIPTION

A testing apparatus illustrated in FIG. 1 is designated generally by the reference numeral 11. The testing apparatus 11 is used for testing electronic circuits such as the microcircuits commonly associated with miniaturized electronic components, sometimes referred to as chips. A single chip 13 illustrated in FIG. 1 is positioned for testing by a plurality of probes 15. The probes 15 are supported by a base member 17 while the chip 13 is supported by a table 19 which is movable relative to the base member 17 to accurately position the chip 13 beneath the probes 15.

In supporting the probes 15, the base member 17 may have the configuration of a ring having a testing station disposed at the center of the ring. The table 19 then moves the chip 13 to be tested into the testing station and the probes 15 are moved relative to the chip 13 to contact predetermined points on the circuit of the chip. The table 19 can be of the type that is independently movable in two transverse directions which is commonly referred to as an X-Y table. The table 19 is preferably movable in a plane that is substantially parallel to the probes 15. Although only three probes 15 are illustrated in FIG. 1, many probes may be positioned around the base member 17 depending on the number of points to be contacted on the chip 13 and the types of tests to be performed by the apparatus 11.

One of the probes 15 is illustrated in greater detail in FIG. 2 with the probe including a dielectric support body 21 having a shank portion 23 with a generally rectangular cross section. The shank portion 23 may be provided with a pair of holes 25 to facilitate attachment of the probe 15 to the base member 17, for example by a pair of screws 27 (FIG. 1). The holes 25 can be oversized, particularly along the longitudinal dimension of the probe 15, to facilitate alignment of the probes with respect to each other on the base member 17. Also, the probes 15 may be mounted on a probe head as described in my copending application, Ser. No. 447,865, filed Mar. 4, 1974, or in any other convenient manner. The functioning of the probes 15 in terms of their movement toward or away from the chip being tested is not dependent upon the manner in which the probes are supported relative to the chip.

In addition to the shank portion 23, the support body 21 may include a nose portion 29 which extends longitudinally of the shank portion. The nose portion 29 is preferably tapered between a transition line 31 next to shank portion 23 and an outer end 33. Thus the nose portion 29 has a cross-sectional area which decreases in moving from the transition line 31 to the outer end 33 which facilitates placement of the probes 15 in proximity to the small testing area of the chip 13.

The probe 15 may include a shortened upper arm 35 and a lengthened lower arm 37 which are each mounted on support body 21. The arms 35 and 37 may be secured to the body 21 through respective engagement with a pair of slots 39 and 41. The arms 35 and 37, thus, extend from the slots 39 and 41, with the upper arm 35 positioned above the nose portion 29 and the lower arm positioned below the nose portion. The arms 35 and 37 have outer or free ends which are joined by an end connection member 47 at junction points 49 and 51. The arms 35 and 37 are preferably formed from beryllium copper and have spring characteristics which facilitate deflection of the arms relative to the nose portion 29.

It is desirable that the end connection member 47 be curved at the junction points 49 and 51 to provide for a more even distribution of stresses during deflection of the arms 35 and 37. In a preferred embodiment these features are provided by a probe arm in which the upper and lower arms 35 and 37 and the connection member 47 are formed from a single piece of beryllium copper which is bent to form a curved surface at the junction points 49 and 51.

It may also be desirable to decrease the resistance of the arms 35 and 37 to deflection by reducing the cross-sectional area of the arms in proximity to the slots 39 and 41. This may be accomplished by providing the arms 35 and 37 with apertures 53 and 55 positioned in proximity to the slots 39 and 41.

In supporting a probe tip relative to the arms 35 and 37, a supporting sleeve 47 may be attached to the connection member 47. The sleeve 47 may have a slightly bent configuration which provides a frictional force to a normally straight needle 59 that is disposed within the sleeve. The needle 49 has a conical configuration at its lower end to define a probe tip 61 at the outermost end of probe 15. The tip 61 may be deflected by the arms 35 and 37 into contact with a predetermined point on the chip 13 being tested. The use of the supporting sleeve 57 with the needle 59 is desirable since it facilitates replacement of the needle when the tip 61 becomes worn. It will be apparent that a similar probe 15 can be provided with a blade 63, illustrated in FIG. 4, which has a tip 65 similar to the tip 61.

Once the tip 61 has provided electrical contact with a predetermined point on the electrical circuit associated with the chip 13, the tip can be energized to perform a desired test. In the illustrated embodiment, a pair of terminals 67 and 69 may be used to energize the tip 61. The terminals 67 and 69 are snugly held by support member 21 within holes which extend vertically through slots 39 and 41. Within slot 39, the terminal 67 forms a contact 71 with upper arm 35 while a hole 73 in the upper arm surrounds the terminal 69 and prevents contact between the terminal 69 and the upper arm. Similarly, within slot 41, the terminal 69 forms a contact 75 with lower arm 37 but terminal 67 is not connected to lower arm 37 by reason of a hole 77 in the lower arm which surrounds terminal 67.

With the tips 61 of a plurality of probes 15 in contact with the chip 13, various probes can be energized in accordance with a desired testing procedure. When a voltage is fed to one of the terminals, for example, the terminal 67, current flows to the needle 59 through the soldered connection 71 and into the electrical circuit on the chip 13. The voltage at the needle 59 can then be sensed through probe arm 37, connection 75, and terminal 69. If the voltage of the needle 59 is not the desired value, the voltage input to terminal 67 can be increased or decreased, as necessary, to correct the voltage at the needle. The voltage sensing line, which may include arm 37, connection 75 and terminal 69, preferably has a high impedance such that the current flow in this line is of a relatively low magnitude.

Other probes 15 which are in contact with the electrical circuit on the chip 13 may then receive an electrical signal from the circuit on the chip. This received signal may be sensed at the associated needle 59 through a high impedance line which will typically include one of the probe arms 35 and 37 of the associated probe 15. The arms 35 and 37, when used in this manner, form a Kelvin lead whose usage is conventional in testing microcircuits.

In the present probe, the line of deflection traversed by the tip 61 relative to the chip 13 is of particular interest. It is desirable that the tip 61 of needle 59 move in a substantially straight line with respect to the surface of chip 13 and with substantially no horizontal or transverse component of movement relative to the chip. A horizontal or transverse component of movement will cause the tip 61 to drag along the predetermined point of the circuit on the chip 13 which will scratch the chip and may physically damage the circuit to the extent that the chip must be discarded. In the past, probe arms have generally been of two types. In some cases, the probes have been provided with a single probe arm; however, in some cases probes have been provided with a pair of probe arms which are equal in length. In both of these types of probes, the probe tips tend to deflect along an arc. Thus, as the chip has contacted the probe tip and moved in a substantially vertical direction, the movement of the probe tip has produced not only a vertical component of motion but also a horizontal component of motion. This horizontal component of motion has caused the probe tip to drag along the electrical circuit and, as a result, the circuit has been scratched.

In accord with the present invention, both of the arms 35 and 37 are deflected simultaneously with the outer ends of the arms being deflected along arcs. For example, as illustrated in FIG. 5, the upper arm 35 deflects along an arc 79 from a free position to a deflected position designated by the numeral 35'. Similarly, the lower arm 37 deflects along an arc 81 from a free position to a deflected position designated by the numeral 37'. It will be noted that the arms 35 and 37 have different lengths so that the arcs 79 and 81 have different radii. Preferably, the upper arm 35 is shorter than the lower arm 37 so that the arc 79 is greater than the arc 81. As a result, the horizontal displacement of the free end of the upper arm 35 is greater than the horizontal displacement of the free end of the lower arm 37.

These deflection characteristics of the arms 35 and 37 are transferred to the needle 59 so that the upper portions of the needle 59 move horizontally to a greater extent than a lower portion of the needle 59. The desirable result of these complex deflection characteristics is the movement of the tip 61 of the needle 59 in a substantially vertical direction with respect to the chip 13. As illustrated in FIG. 5, the needle 59 is moved from the undeflected position shown in solid lines to the deflected position shown by the dotted lines and the tip 61 moves along a line 83 which is substantially perpendicular to the plane of the chip 13.

In the illustrated embodiment, arms 35 and 37 of different lengths are connected to the support body 21 at points of connection which are disposed in substantially the same vertical plane. As a result, the end connection member 47 has a different angular relationship with respect to the arms 35 and 37. In the illustrated embodiment, the connection member 47 forms an obtuse angle with upper arm 35 and an acute angle with the lower arm 37.

If desired, the end connection member 47 may have a substantially perpendicular relationship with both of the arms 35 and 37 and the points of connection of the arms with support body 21 may lie in a plane which is not vertical. Also, it is not necessary that the probe arms be parallel so long as there is a difference in the horizontal components of movement of the free ends of the probe arms which maintains a substantially straight line movement of the probe tip toward and into contact with the chip that is being tested. Thus, for example, the lower arm may be angled upwardly toward the probe tip with the upper arm angled downwardly toward the tip. On bending of the probe arms in a downward direction, the free end of the lower arm would have an outward horizontal component of movement while the free end of the upper arm would have an inward horizontal component of movement that would vary the angle of the probe needle or blade during downward movement in maintaining a substantially straight line movement of the probe tip.

In general, the complex deflection characteristics result from the probe arms 35 and 37 being of different lengths so that they deflect along the different arcs 79 and 81. It is also desirable that the top probe arm, designated by the reference numeral 35, be the shorter of the two probe arms 35 and 37.

Another feature of particular advantage to the present invention is associated with the means for moving the probes 15 into relative engagement with the chip 13. In the past, the chip 13 has been supported on a chuck which has been raised to contact the tip 61 and to deflect the probe 15 upwardly. This has had the disadvantage of requiring upward movement of a chuck having substantial mass and the need to precisely planarize the probes prior to testing.

In accordance with the present invention, means is provided for deflecting the probe arms 35 and 37 so that the probe tip 61 moves into contact with the stationary chip 13. Thus, the movement of the probe tip 61 involves only the relatively small mass of the probe 15. Also, the movement of the probe tip 61 is provided with a minimum number of moving parts which reduces the maintenance required for the testing apparatus.

In a preferred embodiment, a deflector 85 is positioned in proximity to the upper arm 35 to deflect the arms 35 and 37 and the tip 61 downwardly. The deflector 85 may be supported on an extension member 87 which extends from the support body 21 over the upper arm 35 with the extension member provided with apertures 89 and 91 for snugly receiving the terminals 67 and 69. In this manner, the extension member 87 and deflector 85 may be semi-permanently attached to the support body 21.

The deflector 85, which may be snugly supported in a vertical bore 93 in extension member 87, can be any means that is actuatable to force the arms 35 and 37 downwardly. For example, a suitable deflector 85 may be a solenoid whose movement is responsive to an electrical signal.

In a preferred embodiment, the deflector 85 comprises a piston 95 movable within a sleeve 97 and defining with the sleeve 97 by a chamber 99. The piston 95 may be formed from beryllium copper, while the sleeve 97 may be formed from stainless steel needle tubing.

A source of pressurized fluid 101 may be connected to chamber 99 by a piece of tubing 103 formed from a material such as plastic or rubber. When it is desirable to deflect the associated probe 15, fluid from the source 101 may be introduced through the tubing 103 to pressurize the chamber 99. This pressure will move the piston 95 downwardly in FIG. 5 to force the arms 35 and 37 downwardly and to move the tip 61 into contact with the chip 13. The source 101 preferably includes a valve 104 to adjust the pressure of the fluid within a range such as about 10 to about 100 psi. The pressure which may be employed will vary depending on the size of the piston 95, the stiffness of arms 35 and 37, etc., and, thus, the above pressure range is merely illustrative.

A pair of electrical conductors 105 and 107 may be electrically connected through the walls of sleeve 97 to electrodes within the chamber 99. The conductor 105 may be electrically energized so that when the conductive material of piston 95 is in the uppermost position with the probe 15 being undeflected, the signal in conductor 105 is passed to conductor 107. When the piston 95 is then deflected downwardly, the continuity between the conductors 105 and 107 may be broken and the conductors 105 and 107 and associated electrodes, thereby, provide a means for detecting the free state and the deflected state of the probe 15.

The use of a deflector 85 which is pressure actuated is of advantage since the signal used to actuate the deflector is nonelectrical. Under certain circumstances, for example when the chip 13 is a metal-oxide-silicon semiconductor or the like, the presence of an electrical or magnetic signal may damage the chip 13 or otherwise interfere with test results. The use of a pressure actuated deflector 85 also has the advantage of providing a probing force which is dependent upon the pressure of a fluid from source 101 which can be easily and accurately controlled. Also, the probing forces on all of the probes 15 may be controlled simultaneously by actuating all of the deflectors 85 from the same source of pressurized fluid 101 as shown in FIG. 1.

A further advantage of the probe 15 is that the arms 35 and 37 need not be provided with a preload to maintain a substantially constant probing force. Rather, the probing force is almost entirely dependent upon the pressure of the fluid from source 101. Since this pressure can be carefully controlled, the probing force can be maintained substantially constant even with significant deflections of the arms 35 and 37. As a result, the deflection of the tip 61 may be as great as 0.060 inch as compared with the much smaller tip deflections used in preloaded prior art devices. In the use of the present probe, the deflection may be limited to a range of 0.020 to 0.030 inch, if desired, in order to reduce the probing time.

The additional deflection distance provided by the probe 15 of the present invention is of particular advantage when the chip 13 is of the hybrid type. Such a surface may have peaks and valleys separated in the order of 0.020 inch or more.

With previous probes, which are highly dependent upon deflection distance to produce a probing force, a difference in deflection may produce a significant change in the magnitude of the probing force. However, with the probe 15 of the present invention wherein the probing force is much less dependent on deflection distance, chips of the hybrid type may be easily tested.

In the use of pneumatically actuated deflector 85, the piston 95 may be spaced slightly from surrounding sleeve 97, to provide for the escape of a portion of the fluid from the chamber 99. This may provide an air bearing between the piston 95 and associated sleeve 97 to produce a substantially frictionless relationship between these elements.

All of the above features of probe 15 combine to provide an improved means for probing and testing semiconductor devices such as the chip 13. After the chip 13 has been moved by a table 19 into the testing station beneath the probes 15, pressurized fluid from source 101 may be introduced to each of the deflectors 85. With a pressure such as 40 psi or any other suitable pressure, the fluid from source 101 should move the tips of the probes 15 into close proximity with the surface of chip 13. At this point, the probes 15 may be individually adjusted so that the associated tips 61 of the needles 59 just contact the surface of the chip 13.

The individual adjustment of the probes 15 to planarize the probe tips need not be as precise as is required with previous probes. The probe tips need not be planarized for each chip being tested and once the tips of the probes are planarized, a number of chips 13 may be tested before checking the planarity of the probe tips.

Having effectively planarized the tips 61 of probes 15, the valve 104 associated with the fluid source 101 may be adjusted to increase the pressure of fluid with the increased pressure being directly associated with the probing force. It is of advantage that the fluid from source 101 is introduced to each of the probes 15 so that the additional pressure produces substantially the same probing force for each of the probes 15.

Following planarization and the adjustment of valve 104, the chips 13 may be tested in accord with a desired testing method. The testing method may include the steps of moving the chip 13 into the testing station, pressurizing the probes 15 with fluid from the source 101 to deflect the probe tips 61 into contact with the chip, energizing the probe tips to test the chip, and then depressurizing probes 15 to permit retraction of the probe tips from the chip.

As illustrated in FIG. 6, during downward movement of arms 35 and 37 resulting from downward movement of piston 95, the upper arm 35 may bow slightly in an upward direction due to the force exerted by the piston — particularly if the lower arm 37 is stiffer than the upper arm. Bowing of the upper arm 35 causes a movement of the free end 49 to the left from its position shown in FIG. 3 which may be of further assistance in maintaining the movement of tip 61 along a straight line such as line 83. The lower arm 37 may be intentionally made stiffer than the upper arm 35 to provide a controlled upward bowing of the upper arm in providing a desired horizontal component of movement to the free end 49 in addition to horizontal movement of free end 49 resulting from its movement along arc 79 as shown in FIG. 5.

I claim:

1. A probe for testing an electrical circuit on a semiconductor surface comprising:
    a dielectric support body having first and second opposite ends;
    a first conductive spring arm having a length defined by an inner end and an outer end;
    a second conductive spring arm having a length defined by an inner end and an outer end;
    a conductive probe tip having a point;
    the first and second spring arms being connected to the support member at their inner ends for flexure relative to each other and for flexure of the second arm in accordance with the flexure of the first arm and being provided with particular lengths relative to each other to provide for substantially a movement of the probe tip in a straight line in accordance with the flexure of the arms;
    said probe tip being supported by the outer ends of said first and second arms for movement in substantially only a straight line toward the semiconductor surface in accordance with the flexure of the first and second spring means;
    fluid-operated means disposed in cooperative relationship with the flexing means for flexing the first conductive spring arm; and
    means responsive to the operation of the fluid-operated means for indicating whether or not the probe tip has been moved into contact with the electrical circuit on the semiconductor surface.

2. The probe of claim 1 wherein the length of the second arm is greater than the length of the first arm.

3. The probe of claim 1 wherein the fluid-operated means includes:
    a piston; and
    a sleeve disposed in sliding engagement around the piston to form a chamber with the piston,
    whereby the introduction of a fluid into the chamber displaces the piston relative to the sleeve to move the first and second arms relative to the support body and to move the probe tip into contiguous relationship with the electrical circuit.

4. The probe of claim 3 including means for detecting the position of the piston within the sleeve to indicate the position of the point of the probe tip relative to the electrical circuit.

5. The probe of claim 3 wherein a gap is provided between the piston and sleeve to permit a portion of the fluid to escape from the chamber through said gap to provide a fluid bearing between the piston and the sleeve.

6. The probe of claim 3 wherein said piston bears against said first arm with movement of the piston against the first probe arm to produce a bending of the first and second arms in downward direction toward the electrical circuit on the semiconductor surface.

7. The probe of claim 1 wherein said means for bending the first and second arms bears against said first arm to cause the first and second arms to bend in a direction toward the electrical circuit on the semiconductor surface.

8. The probe of claim 6 wherein
said first arm is stiffer than said second arm; and
said first arm is bowed upwardly during its movement toward the electrical circuit on the semiconductor surface by the force exerted by said piston.

9. The probe of claim 7 wherein
said first arm is stiffer than said second arm; and
said first arm is bowed upwardly during its movement by the force exerted by said means for bending the first and second arms.

10. An apparatus for testing a circuit board, comprising:
a base member having a fixed relationship with the circuit board to be tested;
a plurality of probes connected to the base member and individually extending into proximity to the circuit board;
each of said probes including a dielectric support member having a fixed relationship with the base member;
probe tip means providing a probe tip in each of the probes, the probe tip having properties for being electrically energized to test the circuit board;
probe arm means included in each of the probes and having a fixed end attached to the associated support member and a free end supporting the associated probe tip means in proximity to the circuit board, each of the probe arm means including first and second spring arms capable of being flexed relative to each other and being coupled through the probe tip for flexure of the second spring arm in accordance with the flexure of the first spring arm and being provided with particular lengths to obtain a movement of the associated probe tip along a substantially straight line path into contact with the circuit board;
flexing means disposed relative to the base member for individually flexing the first spring arm of the probe arm means of the probes relative to the associated support members to bring the associated probt tips into contact with the circuit board; and
means operatively coupled to the flexing means for indicating whether the flexing means is flexing the probe arm means to provide a contact between the probe tip and the circuit board.

11. The apparatus of claim 10 wherein each of the flexing means comprises:
a piston disposed relative to an associated one of the probe arm means to flex the probe arm means in accordance with the movement of the piston; and
means for individually moving the piston to flex the associated probe arm means in the direction of the circuit board.

12. The apparatus of claim 10 wherein each of the probe arm means comprises:
the first conductive spring arm having a length defined by a fixed end and a free end, the fixed end of the first spring arm being attached to the support means of the associated probe;
the second conductive spring arm having a length defined by a fixed end and a free end, the fixed end of the second spring arm being attached to the support member of the associated probe arm; and
the probe tip connecting the free ends of the first and second arms for sumultaneously obtaining a flexing of the second arm with the flexing of the first arm by the flexing means.

13. The apparatus of claim 10 wherein each of the flexing means is constructed for use with a source of fluid under pressure and includes:
a piston and a sleeve;
each of said sleeves defining a chember with the associated piston; and
means for introducing the fluid under pressure into the chamber to displace the piston relative to the sleeve for flexing of the probe arm means in the direction of the circuit board to be tested.

14. An apparatus for testing an electrical circuit disposed in a particular plane comprising:
a base member;
means movable relative to the base member in the particular plane for moving the electrical circuit to be tested into the testing station;
a support member fixed to the base member;
probe arm means fixed to the support member at its inner end and deflectable relative to the base member in a direction transverse to the particular plane and into proximity to the electrical circuit to be tested;
a probe tip disposed at the outer end of the probe arm means and disposed relative to the testing station to provide a contiguous relationship with the electrical circuit when the probe arm means is deflected in a direction toward the electrical circuit;
the probe arm means being constructed to provide a movement of the probe tip in a substantially straight line in a direction perpendicular to the electrical circuit in accordance with the deflection of the probe arm means in a direction toward or away from the electrical circuit and including a pair of spring arms having individual lengths relative to each other and constructed to be flexed relative to each other during the movement of the probe tip toward the electrical circuit to maintain the movement of the probe tip in the straight line;
means to deflect said probe arm means for obtaining a movement of said probe tip into contiguous relationship with the electrical circuit; and
means responsive to the operation of said deflecting means for indicating when the probe tip has been moved into contact with the electrical circuit.

15. A probe for testing an integrated microcircuit on a semiconductor surface, said probe comprising:
a dielectric support body;
a probe tip having a point;
electrically conductive support means securing said tip to said body for movement of said tip in an arcuate path directed toward said integrated microcircuit on the semiconductor surface;
said support means being constructed to provide an outwardly directed horizontal movement of said probe tip to said point during movement of said tip toward the integrated microcircuit on the semiconductor surface to compensate for movement of said point parallel to the semiconductor surface during the arcuate path of movement of said tip toward said semiconductor surface and to maintain the movement of the probe tip in a straight line substantially perpendicular to the integrated microcircuit, the support means including a pair of resilient arms supporting the probe tip and having individual lengths and spaced from each other in the direction of movement of the probe tip toward the integrated microcircuit and resiliently movable relative to each other in accordance with the movement of the probe tip toward the integrated microcircuit to compensate for the arcuate path of movement of the probe tip and to maintain the movement of the probe tip in the substantially perpendicular line toward the integrated microcircuit;

means operatively coupled to said support means to move said tip toward said semiconductor surface, whereby the point of said tip moves in a substantially straight line downward movement toward said surface without any substantial horizontal movement of said point; and means operatively coupled to the moving means for indicating whether the moving means has moved the support means to a position providing an electrical contact between the probe tip and the integrated microcircuit on the semiconductor surface.

16. The probe of claim 15 wherein said means to move said tip includes:
a sleeve and a piston disposed for relative movement within the sleeve to contact said support means.

17. The probe of claim 15 including means for indicating the position of the point of the probe tip relative to the microcircuit being tested.

18. A probe for testing an electrical circuit comprising:
a dielectric support body having first and second opposite sides;
a first conductive spring arm having a first length defined by an inner end and an outer end, the first arm being supported at its inner end by the first side of the support body;
a second conductive spring arm having a second length defined by an inner end and an outer end where the second length is longer than the first length, the second arm being supported at its inner end by the second side of the support body and being free for flexure at its outer end relative to the outer end of the first arm;
a conductive probe tip supported by the outer ends of the first arm and the second arm;
means for deflecting the first arm and the second arm for moving the probe tip into contiguous relationship with the electrical circuit to be tested, the first arm being bent in a first arc which provides movement in a lateral direction, the second arm being bent along a second arc which has a larger radius than the first arc and which provides movement in a lateral direction with the lateral movement provided by said first arm being greater than the lateral movement provided by said second arm to compensate for lateral movements of the probe tip during the deflection of the first and second arms;
said means for bending the first and second arms including a piston and a sleeve disposed in sliding engagement around the piston to form a chamber with the piston; and
means for detecting the position of the piston within the sleeve to indicate whether the point of the probe tip is engaging the electrical circuit,
whereby the introduction of a fluid into the chamber displaces the piston relative to the sleeve to move the first and second arms relative to the support body and to move the probe tip into contiguous relationship with the electrical circuit.

19. An apparatus for testing circuit board comprising:
a base member having a fixed relationship with the circuit board to be tested;
a plurality of probes connected to the base member and individually extending into proximity to the circuit board;
each of said probes including a support member having a fixed relationship with the base member;
probe tip means providing a probe tip in each of the probes, the probe tip having properties for being energized to test the circuit board;
probe arm means included in each of the probes and including a pair of resilient probe arms spaced from each other in the direction of movement of the probe arm means toward the circuit board and having individual lengths and resiliently movable relative to each other and having a fixed end attached to the associated support member and a free end supporting the associated probe tip means in proximity to the circuit board, the probe arm means being resiliently bendable relative to the associated support member and relative to each other for moving the associated probe tip along a substantially straight line path into contact with the circuit board;
bending means disposed relative to the base member for individually bending the probe arm means of the probes relative to the associated support members to bring the associated probe tips into contact with the circuit board; and
means for individually indicating the positions of the points of the probe tips relative to the circuit board being tested.

20. A probe for testing an integrated microcircuit on a semiconductor surface, said probe comprising:
a dielectric support body;
a probe tip having a point;
electrically conductive support means including first and second spaced arms each having resilient properties and individual lengths and movable resiliently relative to the other spaced arm and each having first and second ends and supported by the support body at the first end and directly securing said tip at said second end and having properties of being deflected for movement of said tip in an arcuate path directed inward toward said body while changing the angle between said probe tip and the semiconductor surface to impart, by the deflection of the first and second arms in said support means, an outwardly directed component of movement to said point to compensate for inward movement of the point resulting from the arcuate path of movement of the said tip such that the point of said tip moves in a substantially straight line toward the semiconductor surface during arcuate movement of said tip;
means to deflect said electrically conductive support means in moving said tip toward said semiconductor surface; and
means operatively coupled to the deflecting means for indicating the movement of the deflecting means toward the support means.

21. The probe of claim 20 wherein the deflecting means is fluid-operated.

22. An apparatus for testing a circuit board, comprising:
a base member having a fixed relationship with the circuit board to be tested;

a plurality of probes connected to the base member and individually extending into proximity to the circuit board;

each of said probes including a support member having a fixed relationship with the base member;

probe tip means providing a probe tip in each of the probes, the probe tip having properties for being energized to test the circuit board;

probe arm means included in each of the probes and having a fixed end attached to the associated support member and a free end supporting the associated probe tip means in proximity to the circuit board, the probe arm means including first and second probe arms spaced from each other at individual distances from the circuit board and provided with individual lengths and supporting the probe tip means at their free ends and being resiliently bendable relative to the associated support member and relative to each other for moving the associated probe tip along a substantially straight line path into contact with the circuit board;

bending means disposed relative to the base member for resiliently bending the first and second probe arms in the probe arm means of the probes relative to the associated support members to bring the associated probe tips into contact with the circuit board; and means for individually indicating the position of the points of the probe tips relative to the circuit board being tested.

23. The apparatus of claim 22 wherein the source of fluid under pressure includes means for simultaneously adjusting the pressure of the fluid being introduced into the chambers of the bending means for the probes.

24. An apparatus for testing an electrical circuit disposed in a particular plane comprising:

a base member;

means movable relative to the base member in the particular plane for moving the electrical circuit to be tested into the testing station;

a support member fixed to the base member;

probe arm means fixed to the support member and deflectable relative to the base member in a direction transverse to the particular plane and into proximity to the electrical circuit to be tested;

a probe tip disposed at the end of the probe arm means and disposed relative to the testing station to provide a contiguous relationship with the electrical circuit when the probe arm means is deflected toward the electrical circuit;

the probe arm means being constructed to provide a movement of the probe tip in a substantially straight line in a direction perpendicular to the electrical circuit in accordance with the deflection of the probe arm means;

means to deflect said probe arm means for obtaining a movement of said probe tip into contiguous relationship with the electrical circuit;

means responsivve to the operation of said deflecting means for indicating when the probe tip has been moved into contact with the electrical circuit;

a sleeve having a fixed relationship with the support member;

a piston movable within the sleeve into contiguous relationship with the probe arm and defining a chamber with the piston;

means for moving the piston within the sleeve for deflecting the probe arm relative to the support member to bring the probe tip into contact with the electrical circuit; and the indicating means being responsive to the movement of the piston.

25. The apparatus of claim 24 wherein the probe arm means includes a first arm having a first length for deflection along a first arc to provide a component of motion in a lateral direction relative to the electrical circuit;

a second arm disposed in spaced relationship to the first arm and having a second length greater than said first length; and means connecting the first arm and the second arm for deflecting the second arm simultaneously, with the deflection of the first arc, along a second arm different from the first arc to provide the probe tip with a component of motion in a lateral direction which is less than the movement in a lateral direction provided by said first arm such that the movement of the probe tip with respect to the electrical circuit is in substantially a straight line perpendicular to the electrical circuit.

26. The apparatus of claim 24 including: pneumatic means for deflecting said probe arm.

* * * * *